United States Patent
Liu et al.

(10) Patent No.: US 9,754,529 B2
(45) Date of Patent: *Sep. 5, 2017

(54) GATE CONTROLLING UNIT, GATE CONTROLLING CIRCUIT, ARRAY SUBSTRATE AND DISPLAY PANEL

(71) Applicants: Shanghai AVIC OPTO Electronics Co., Ltd., Shanghai (CN); Tianma Micro-Electronics Co., Ltd., Shenzhen (CN)

(72) Inventors: Bo Liu, Shanghai (CN); Kerui Xi, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/411,556

(22) Filed: Jan. 20, 2017

(65) Prior Publication Data

US 2017/0132967 A1    May 11, 2017

Related U.S. Application Data

(63) Continuation of application No. 14/608,086, filed on Jan. 28, 2015, now Pat. No. 9,589,536.

(30) Foreign Application Priority Data

Oct. 9, 2014    (CN) .......................... 2014 1 0528041

(51) Int. Cl.
*G09G 3/36* (2006.01)
*G09G 3/20* (2006.01)
*G06F 3/041* (2006.01)

(52) U.S. Cl.
CPC ......... *G09G 3/2092* (2013.01); *G06F 3/0412* (2013.01); *G06F 3/0416* (2013.01);
(Continued)

(58) Field of Classification Search
CPC ... G09G 3/36; G09G 3/20; G09G 5/00; G11C 19/00; H03B 1/00; G06F 3/041; G06F 3/038; G02F 1/1345; H03K 3/00
See application file for complete search history.

(56) References Cited

U.S. PATENT DOCUMENTS

| | | | |
|---|---|---|---|
| 2008/0055225 | A1 | 3/2008 | Pak et al. |
| 2011/0222645 | A1 | 9/2011 | Tobita |
| 2011/0228893 | A1 | 9/2011 | Tobita et al. |

FOREIGN PATENT DOCUMENTS

| | | |
|---|---|---|
| CN | 1251162 C | 4/2003 |
| CN | 103996370 A | 8/2014 |

*Primary Examiner* — Pegeman Karimi
(74) *Attorney, Agent, or Firm* — Faegre Baker Daniels LLP

(57) ABSTRACT

A gate controlling unit, a gate controlling circuit, an array substrate and a display panel, where, the gate controlling unit includes: a gate driving subunit configured for driving a gate line; a first reset subunit configured for resetting the gate driving subunit after the gate driving subunit finishes driving the gate line; and a suspension and resumption subunit configured for controlling the gate driving subunit to suspend and resume the gate driving subunit. The gate controlling circuit, formed by cascaded gate controlling units connected in series, can be suspended and resumed several times within a frame. The display panel with the gate controlling circuit can perform scanning of the touch signal during the suspension time period, thereby ensuring the stability of the display system and both improved touch position reporting rate and better linearity of the touch system.

6 Claims, 10 Drawing Sheets

(52) U.S. Cl.
CPC . *G09G 2300/08* (2013.01); *G09G 2310/0267* (2013.01); *G09G 2310/0286* (2013.01); *G09G 2310/08* (2013.01)

--Prior Art--

GATE CONTROLLING UNIT, GATE CONTROLLING CIRCUIT, ARRAY SUBSTRATE AND DISPLAY PANEL

CROSS-REFERENCE TO RELATED APPLICATION

This application is a continuation of U.S. application Ser. No. 14/608,086, filed Jan. 28, 2015, which claims priority to Chinese Application No. 201410528041.8, filed on Oct. 9, 2014, entitled "Gate Controlling Unit, Gate Controlling Circuit, Array Substrate and Display Panel", the disclosure of which is incorporated herein by reference in its entirety.

TECHNICAL FIELD

The present disclosure relates to the field of display technologies, in particular to a gate controlling unit, a gate controlling circuit, an array substrate and a display panel.

BACKGROUND

With the development of display technologies, display panels have been increasingly, widely used. Often, during operation of a display panel, a gate controlling circuit in the display panel generates scanning signals to respectively drive gate lines in an array substrate in sequence, so that a data signal can be transmitted to each of a plurality of pixel units in the array substrate. The above scanning signal is generated by a gate controlling unit having a shift register function in the gate controlling circuit.

FIG. 1 shows a circuit diagram of a gate controlling unit in the related art. As shown in FIG. 1, the gate controlling unit includes: a first N-channel Metal Oxide Semiconductor (NMOS) transistor MN1, where a gate electrode of the first NMOS transistor MN1 is electrically connected with a trigger signal input terminal SET configured for receiving a trigger signal, a source electrode of the first NMOS transistor MN1 is electrically connected with a first node P0, and a drain electrode of the first NMOS transistor MN1 is electrically connected with a first level signal input terminal VGH configured for receiving a first level signal; a second NMOS transistor MN2, where a gate electrode of the second NMOS transistor MN2 is electrically connected with a reset signal input terminal RESET configured for receiving a reset signal, a source electrode of the second NMOS transistor MN2 is electrically connected with a second level signal input terminal DIR configured for receiving a second level signal, and a drain electrode of the second NMOS transistor MN2 is electrically connected with the first node P0; a third NMOS transistor MN3, where a gate electrode of the third NMOS transistor MN3 is electrically connected with a second node Q0, a source electrode of the third NMOS transistor MN3 is electrically connected with a third level signal input terminal VGL configured for receiving a third level signal, and a drain electrode of the third NMOS transistor MN3 is electrically connected with the first node P0; a fourth NMOS transistor MN4, where a gate electrode of the fourth NMOS transistor MN4 is electrically connected with the first node P0, a source electrode of the fourth NMOS transistor MN4 is electrically connected with the third level signal input terminal VGL, and a drain electrode of the fourth NMOS transistor MN4 is electrically connected with the second node Q0; a fifth NMOS transistor MN5, where a gate electrode of the fifth NMOS transistor MN5 is electrically connected with the first node P0, a source electrode of the fifth NMOS transistor MN5 is electrically connected with an output terminal GOUT configured for generating an output signal, and a drain electrode of the fifth NMOS transistor MN5 is electrically connected with a first clock signal input terminal CKB configured for receiving a first clock signal; a sixth NMOS transistor MN6, where a gate electrode of the sixth NMOS transistor MN6 is electrically connected with the second node Q0, a source electrode of the sixth NMOS transistor MN6 is electrically connected with the third level signal input terminal VGL, and a drain electrode of the sixth NMOS transistor MN6 is electrically connected with the output terminal GOUT; a seventh NMOS transistor MN7, where a gate electrode of the seventh NMOS transistor MN7 is electrically connected with a second clock signal input terminal CK configured for receiving a second clock signal, a source electrode of the seventh NMOS transistor MN7 is electrically connected with the third level signal input terminal VGL, and a drain electrode of the seventh NMOS transistor MN7 is electrically connected with the output terminal GOUT; a first capacitor C11, where a first plate of the first capacitor C11 is electrically connected with the first clock signal input terminal CKB, and a second plate of the first capacitor C11 is electrically connected with the second node Q0; and a second capacitor C12, where a first plate of the second capacitor C12 is electrically connected with the first node P0, and a second plate of the second capacitor C12 is electrically connected with the output terminal GOUT.

The gate controlling unit of FIG. 1 has a shift register function, and can generate a scanning signal to drive a row of gate lines. A gate electrode controlling circuit, which includes cascaded gate controlling units connected in series, can drive the gate lines on the array substrate line by line. However, after a first stage gate controlling unit generates a scanning signal, the gate electrode controlling circuit continues to drive the next stage gate controlling unit. In such a case, when various in-cell touch systems (such as an in-cell capacitive screen or electromagnetic screen) are employed in such display panels, the scanning of the touch signals is synchronized with the scanning by the display signals, which may cause drawbacks such as instability of the display system, touch position reporting mistakes and poor linearity of the touch system.

SUMMARY

Embodiments of the present disclosure provide a gate controlling unit, a gate controlling circuit, an array substrate and a display panel, which solve technical problems in the related art that, after a gate controlling circuit including the gate controlling units employed in a display panel with various in-cell touch systems, where the scanning of the touch signal is synchronized with the scanning by the display signals, causing drawbacks such as instability of the display system, touch position reporting mistakes and poor linearity of the touch system.

Embodiments of the disclosure provide a gate controlling unit, including:
 a gate driving subunit configured for driving a gate line;
 a first reset subunit configured for resetting the gate driving subunit after the gate driving subunit finishes driving the gate line; and
 a suspension and resumption subunit configured for controlling the gate driving subunit to suspend and resume the gate driving subunit.

Some embodiments of the disclosure provide a gate controlling circuit, including n stages of the above cascaded gate controlling units connected in series, wherein, n is a positive integer, and the gate controlling circuit suspends and resumes several times within a frame.

Some embodiments of the disclosure provide an array substrate, including the above gate controlling circuit.

Some embodiments of the disclosure provide a display panel, including the above array substrate.

With the gate controlling unit, the gate controlling circuit, the array substrate, and the display panel, according to embodiments described in the disclosure, the gate controlling unit is provided with the suspension and resumption subunit in order to control the gate controlling unit to be suspended and resumed. Further, the gate controlling circuit formed by the above cascaded gate controlling units connected in series can be suspended and resumed several times within a frame. Similarly, both the array substrate with the gate controlling circuit and the display panel with the array substrate can achieve the suspension and resumption several times within a frame. After various in-cell touch systems are employed in the display panel, scanning of the touch signal can be performed during the suspension time period, so that scanning of the touch signal and scanning by the display signals are time-divided, thereby ensuring the stability of the display system and both an improved touch position reporting rate and better linearity of the touch system.

While multiple embodiments are disclosed, still other embodiments will become apparent to those skilled in the art from the following detailed description, which shows and describes illustrative embodiments. Accordingly, the drawings and detailed description are to be regarded as illustrative in nature and not restrictive.

BRIEF DESCRIPTION OF THE DRAWINGS

Other features, objects and advantages of the disclosure will become apparent from the following detailed description and drawings, in which.

Figure 1:
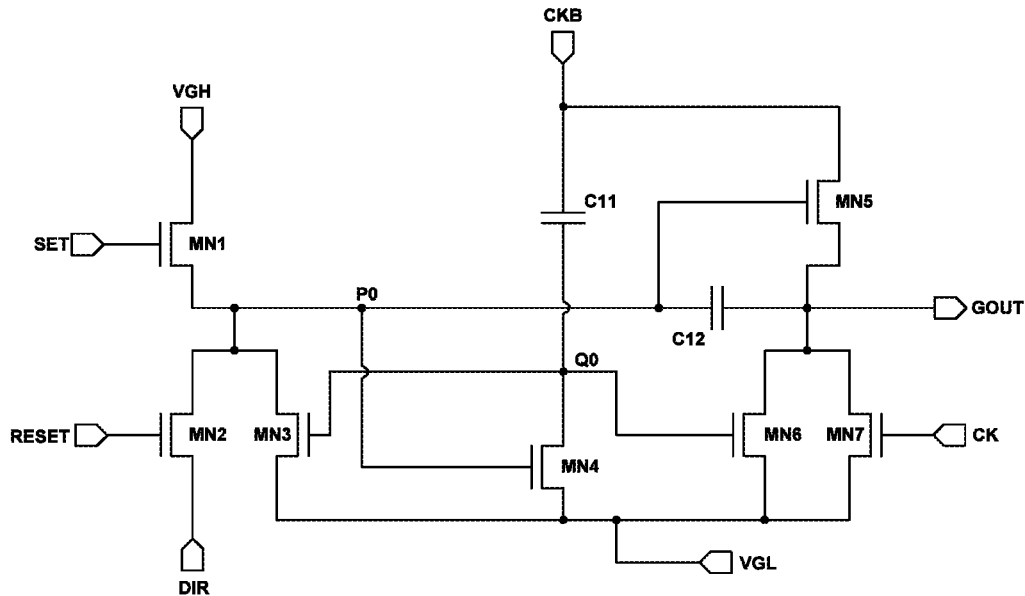
FIG. 1 is a circuit diagram illustrating a gate controlling unit.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

Embodiments of the disclosure are further described below in conjunction with the accompanying drawings. It may be understood that embodiments described herein are for explaining the disclosure rather than limiting the disclosure. Additionally, it is noted that partial contents rather than all contents may be illustrated in the accompanying drawings for ease of description.

Figure 2:
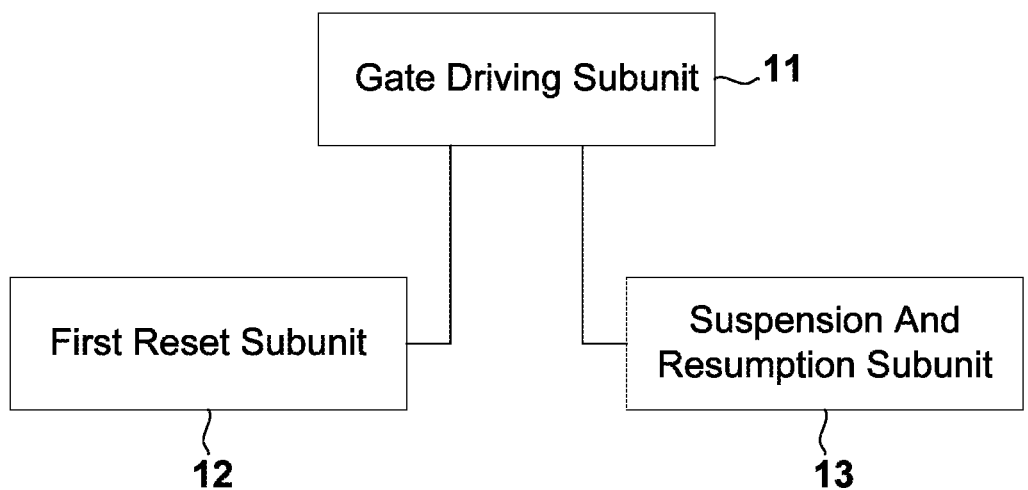
FIG. 2 is a schematic diagram illustrating the structure of a gate controlling unit according to embodiments of the disclosure.

Embodiments of the disclosure provide a gate controlling unit. FIG. 2 is a schematic diagram of the structure of the gate controlling unit according to embodiments of the disclosure. As shown in FIG. 2, the gate controlling unit includes: a gate driving subunit 11 configured for driving a gate line; a first reset subunit 12 configured for resetting the gate driving subunit 11 after the gate driving subunit 11 finishes driving the gate line; and a suspension and resumption subunit 13 configured for controlling the gate driving subunit 11 to suspend and resume the gate driving subunit 11.

It is noted that driving a gate line by the gate driving subunit 11 means that the gate driving subunit 11 generates a scanning signal and provides a gate line with the scanning signal to drive the gate line. The above gate driving subunit can be embodied by a circuit having a shift register function, such as a shift register.

Due to the suspension and resumption subunit 13 provided in the gate controlling unit, the gate driving subunit 11 can be controlled anytime during the operation of the gate controlling unit to enable the suspension of the gate driving subunit 11, and the starting time point and the time period of the suspension can be configured as desired. In addition, the gate driving subunit 11 is controlled to enable the resumption of gate driving subunit 11 in order to continue performing the function of the gate driving subunit 11.

Based on the above principle, the gate controlling unit, according to embodiments of the disclosure, can be implemented in various forms.

Figure 3A:
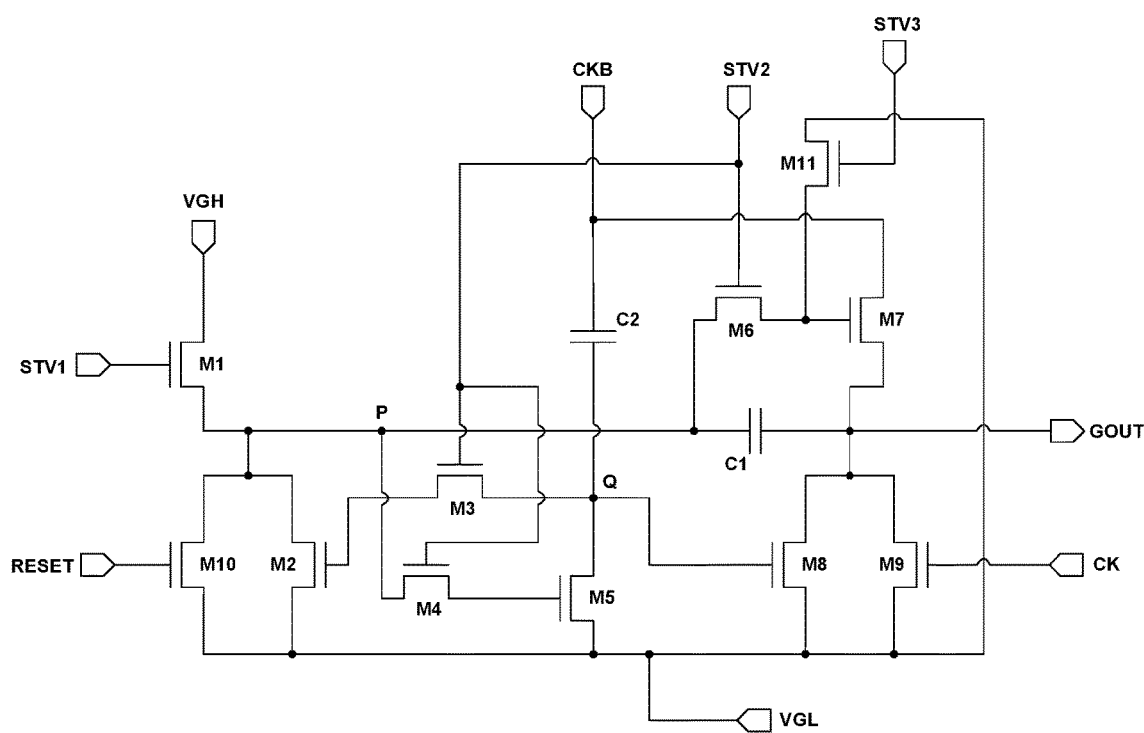
FIG. 3A is a circuit diagram illustrating a gate controlling unit according to embodiments of the disclosure.

FIG. 3A is a circuit diagram of a gate controlling unit, according to embodiments of the disclosure. Referring to FIG. 3A, a gate driving subunit included in a gate controlling unit includes: a first transistor M1, a second transistor M2, a third transistor M3, a fourth transistor M4, a fifth transistor M5, a sixth transistor M6, a seventh transistor M7, an eighth transistor M8, a ninth transistor M9, a first capacitor C1, a second capacitor C2, a first clock signal input terminal CKB, a second clock signal input terminal CK, a first trigger signal input terminal STV1, a second trigger signal input terminal STV2, a first level signal input terminal VGH, a second level signal input terminal VGL and an output terminal GOUT; a gate electrode of the first transistor M1 is electrically connected with the first trigger signal input terminal STV1, a drain electrode of the first transistor M1 is electrically connected with the first level signal input terminal VGH, and a source electrode of the first transistor M1 is electrically connected with a first node P; a gate electrode of the second transistor M2 is electrically connected with a drain electrode of the third transistor M3, a drain electrode of the second transistor M2 is electrically connected with the first node P, and a source electrode of the second transistor M2 is electrically connected with the second level signal input terminal VGL; a gate electrode of the third transistor M3 is electrically connected with the second trigger signal input terminal STV2, a source electrode of the third transistor M3 is electrically connected with a second node Q, and the drain electrode of the third transistor M3 is electrically connected with the gate electrode of the second transistor M2; a gate electrode of the fourth transistor M4 is electrically connected with the second trigger signal input terminal STV2, a drain electrode of the fourth transistor M4 is electrically connected with a gate electrode of the fifth transistor M5, and a source electrode of the fourth transistor M4 is electrically connected with the first node P; the gate electrode of the fifth transistor M5 is electrically connected with the drain electrode of the fourth transistor M4, a drain electrode of the fifth transistor M5 is electrically connected with the second node Q, and a source electrode of the fifth transistor M5 is electrically connected with the second level signal input terminal VGL; a gate electrode of the sixth transistor M6 is electrically connected with the second trigger signal input terminal STV2, a drain electrode of the sixth transistor M6 is electrically connected with the first node P, and a source electrode of the sixth transistor M6 is electrically connected with a gate electrode of the seventh transistor M7; the gate electrode of the seventh transistor M7 is electrically connected with the source electrode of the sixth transistor M6, a drain electrode of the seventh transistor M7 is electrically connected with the first clock signal input terminal CKB, and a source electrode of the seventh transistor M7 is electrically connected with the output terminal GOUT; a gate electrode of the eighth transistor M8 is electrically connected with the second node Q, a drain electrode of the eighth transistor M8 is electrically connected with the output terminal GOUT, and a source electrode of the eighth transistor M8 is electrically connected with the second level signal input terminal VGL; a gate electrode of the ninth transistor M9 is electrically connected with the second clock signal input terminal CK, a drain electrode of the ninth transistor M9 is electrically connected with the output terminal GOUT, and a source electrode of the ninth transistor M9 is electrically connected with the second level signal input terminal VGL; a first plate of the first capacitor C1 is electrically connected with the first node P, and a second plate of the first capacitor C1 is electrically connected with the output terminal GOUT; and a first plate of the second capacitor C2 is electrically connected with the first clock signal input terminal CKB, and a second plate of the second capacitor C2 is electrically connected with the second node Q.

Further, referring to FIG. 3A, the first reset subunit included in the gate controlling unit includes: a tenth transistor M10 and a first reset signal input terminal RESET, where, a gate electrode of the tenth transistor M10 is electrically connected with the first reset signal input terminal RESET, a drain electrode of the tenth transistor M10 is electrically connected with the first node P of the gate driving subunit, and a source electrode of the tenth transistor M10 is electrically connected with the second level signal inputting terminal VGL of the gate driving subunit; and the suspension and resumption subunit forming the gate controlling unit includes: an eleventh transistor M11 and a third trigger signal input terminal STV3, where, a gate electrode of the eleventh transistor M11 is electrically connected with the third trigger signal input terminal STV3, a drain electrode of the eleventh transistor M11 is electrically connected with the second level signal input terminal VGL of the gate driving subunit, and a source electrode of the eleventh transistor M11 is electrically connected with the gate electrode of the seventh transistor M7 of the gate driving subunit.

As shown in FIG. 3A, the first to the eleventh transistors M1 to M11 are NMOS transistors and operation of the gate controlling unit is described herein with reference to using NMOS transistors. Alternatively, the first to the eleventh transistors M1 to M11 may be PMOS transistors, where the corresponding operating principle is similar to the case where NMOS transistors are used, with the difference being that high level and low level signals are interchanged, which is not discussed repeatedly herein. For example, in FIG. 3A, when the first trigger signal is at a high level, the first transistor M1, which is an NMOS transistor, is turned on; however, when the first transistor M1 is a PMOS transistor, the first trigger signal should be at a low level to turn on the first transistor M1.

Also, the first to the eleventh transistors M1 to M11 may be any of amorphous silicon thin film transistors, Indium Gallium Zinc Oxide (IGZO) thin film transistors and Low Temperature Poly-Silicon (LTPS) thin film transistors. If LTPS thin film transistors are selected, each of the above transistors is formed of two such LTPS thin film transistors, where, in such two LTPS thin film transistors, a source electrode of the first LTPS thin film transistor is configured as a source electrode of the formed transistor, a drain electrode of the first LTPS thin film transistor is electrically connected with a source electrode of the second LTPS thin film transistor, a drain electrode of the second LTPS thin film transistor is configured as a drain electrode of the formed transistor, and gate electrodes of the two LTPS thin film transistors are electrically connected together to be configured as a gate electrode of the formed transistor. When the transistors are LTPS thin film transistors and are configured in the above manner, the formed transistor can avoid electric leakage and threshold shift.

Also, the first level signal input terminal VGH is configured for receiving a first level signal, the second level signal input terminal VGL is configured for receiving a second level signal, and both the first level signal and the second level signal are constant signals; the first clock signal input terminal CKB is configured for receiving a first clock signal, the second clock signal input terminal CK is configured for receiving a second clock signal, both the first clock signal and the second clock signal are pulse signals, and the first clock signal is the inverse of the second clock signal; the first trigger signal input terminal STV1 is configured for receiving a first trigger signal, the second trigger signal input terminal STV2 is configured for receiving a second trigger signal, the third trigger signal input terminal STV3 is configured for receiving a third trigger signal, the first trigger signal, the second trigger signal, and the third trigger signal all are pulse signals, where, the second trigger signal is the inverse of the third trigger signal; and the first reset signal input terminal RESET is configured for receiving a first reset signal which is a pulse signal.

It is noted that in FIG. 3A, the first clock signal, the second clock signal, the first trigger signal, the second trigger signal and the third trigger signal may have a high level larger than 5V and a low level in the range from −15V to −3V; additionally, the first level signal is a high level signal and the level value thereof can be larger than or equal to 5V; the second level signal is a low level signal and the level value thereof can be in a range from −15V to −3V; additionally, the level value of each of the above signals can be set depending on the configuration types of the transistors and actual requirements.

Figure 3B:
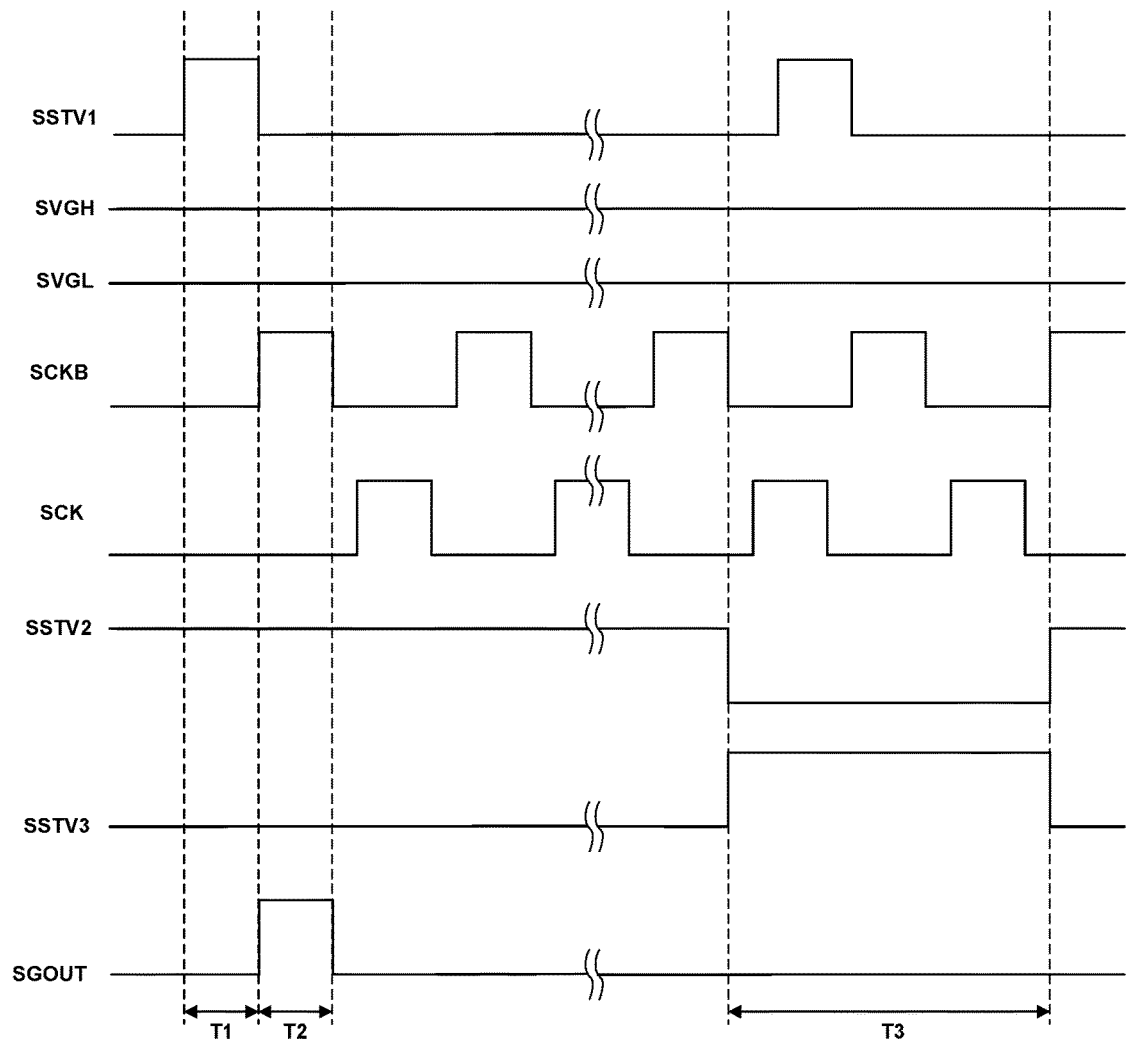
FIG. 3B is a timing diagram illustrating various signals of the gate controlling unit of FIG. 3A.

FIG. 3B is a timing diagram of various signals of the gate controlling unit in FIG. 3A. As shown in FIG. 3B, SSTV1 represents the first trigger signal, SSTV2 represents the second trigger signal, SSTV3 represents the third trigger signal, SCKB represents the first clock signal, SCK represents the second clock signal, SVGH represents the first level signal, SVGL represents the second level signal, and SGOUT represents the outputted scanning signal. Next, operation of the gate controlling unit in FIG. 3A is further illustrated in combination with FIG. 3B.

Referring to FIGS. 3A and 3B, operating states of the gate controlling unit can include: a charging stage T1, a scanning signal generating stage T2, a suspension stage T3 and a resumption stage.

In the charging stage T1, the first trigger signal SSTV1 having a high level controls the first transistor M1 to turn on, the second trigger signal SSTV2 having a high level controls the sixth transistor M6 to turn on, the third trigger signal SSTV3 having a low level controls the eleventh transistor M11 to turn off, the second clock signal SCK having a low level controls the ninth transistor M9 to turn off, the first level signal SVGH having a high level is applied to the gate electrode of the seventh transistor M7 via the first node P and the sixth transistor M6 in order to control the seventh transistor M7 to turn on, the first clock signal SCKB (the first clock signal SCKB is a low level signal in the charging stage) which is the inverse of the first trigger signal in the charging stage T1 is applied to the output terminal GOUT via the seventh transistor M7 so that the first clock signal SCKB is used as a scanning signal SGOUT in the charging stage, and the first level signal SVGH is employed for charging the first node P.

In the scanning signal generating stage T2, the first trigger signal SSTV1 having a low level controls the first transistor M1 to turn off, the second trigger signal SSTV2 having a high level controls the sixth transistor M6 to turn on, the third trigger signal SSTV3 having a low level controls the eleventh transistor M11 to turn off, the second clock signal SCK having a low level controls the ninth transistor M9 to turn off, a potential of the first node P is applied to the gate electrode of the seventh transistor M7 via the sixth transistor M6 in order to control the seventh transistor M7 to turn on, the first clock signal SCKB (the first clock signal SCKB is a high level signal in the scanning signal generating stage T2) having a high level similar to the first trigger signal SSTV1 in the charging stage T1. The first clock signal SCKB is applied to the output terminal GOUT via the seventh transistor M7 so that the first clock signal SCKB is used as an output signal SGOUT of the scanning signal generating stage T2, and the output signal SGOUT is a scanning signal for driving a gate line.

It is noted that in the gate controlling unit shown in FIG. 3A, the first trigger signal SSTV1 has a driving effect on the gate controlling unit when the first trigger signal SSTV1 is a high level signal. As a result, when the output signal SGOUT is a high level signal, the output signal SGOUT is a scanning signal configured for driving a gate line. By the charging stage T1 and the scanning signal generating stage T2, the gate controlling unit implements the shift register function.

After the scanning signal generating stage T2, the operating stages of the gate controlling unit can further include a reset stage. Specifically in the reset stage, the first reset signal having a high level turns on the tenth transistor M10, the second level signal SVGL having a low level is applied to the first node P via the tenth transistor M10 in order to enable the first node P to jump from a high level in the scanning signal generating stage T2 to a low level, so that it can prevent a change of the first clock signal SCKB from affecting the output signal SGOUT, such as when the scanning signal is not generated (i.e., the output signal SGOUT is a low level signal).

In the suspension stage T3, the second trigger signal SSTV2 having a low level controls the sixth transistor M6 to turn off, the third trigger signal SSTV3 having a high level controls the eleventh transistor M11 to turn on, and the gate controlling unit suspends the generation of the scanning signal.

Specifically, in the suspension stage T3, since the eleventh transistor M11 is turned on, the second level signal SVGL having a low level is applied to the gate electrode of the seventh transistor M7 via the eleventh transistor M11. Further, since the sixth transistor M6 is turned off, a low level is always applied to the gate electrode of the seventh transistor M7 in the suspension stage T3, so that the seventh transistor M7 is turned off, and the first clock signal SCKB cannot be transmitted to the output terminal GOUT. As a result, the gate controlling unit suspends the generation of the scanning signal in the suspension stage T3.

It is noted that in FIG. 3B, the scanning signal may never be generated for a time period between the scanning signal generating stage T2 and the suspension stage T3, and a time period in which the scanning signal is generated may also include the charging stage T1, the scanning signal generating stage T2 and a stage without generating the scanning signal, but does not include the suspension stage T3.

In the resumption stage, the second trigger signal SSTV2 having a high level controls the sixth transistor M6 to turn on, the third trigger signal SSTV3 having a low level controls the eleventh transistor M11 to turn off, and the gate controlling unit resumes the generation of the scanning signal.

It is noted that the resumption stage corresponds to the suspension stage T3, meaning that a resumption stage is performed every time after a suspension stage T3. In the resumption stage, the second trigger signal SSTV2 is a high level signal, and the third trigger signal SSTV3 is a low level signal, and accordingly, the sixth transistor M6 is turned on, and the eleventh transistor M11 is turned off. As a result, the gate controlling unit can be performed in the subsequent charging stage T1 and the scanning signal generating stage T2.

Figure 3C:
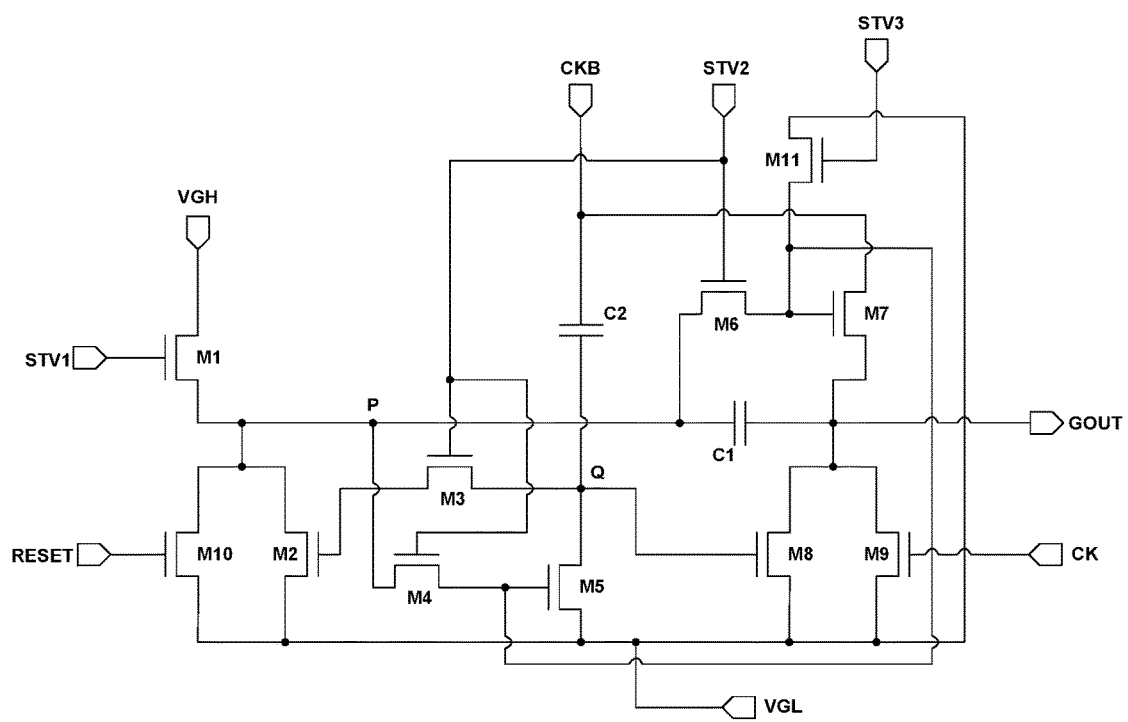
FIG. 3C is a circuit diagram illustrating another gate controlling unit according to embodiments of the disclosure.

On the basis of the gate controlling unit shown in FIG. 3A, and further referring to FIG. 3C, the gate electrode of the fifth transistor M5 is electrically connected with the gate electrode of the seventh electrode M7. By electrically connecting the gate electrode of the fifth transistor M5 with the gate electrode of the seventh electrode M7, the potentials of the gate electrodes of both the fifth transistor M5 and the seventh transistor M7 remain stable to keep the output signal SGOUT stable. In such a case, the operating states of the gate controlling unit are as shown in FIG. 3B and as described in the above description, which will not be repeated here.

Figure 3D:
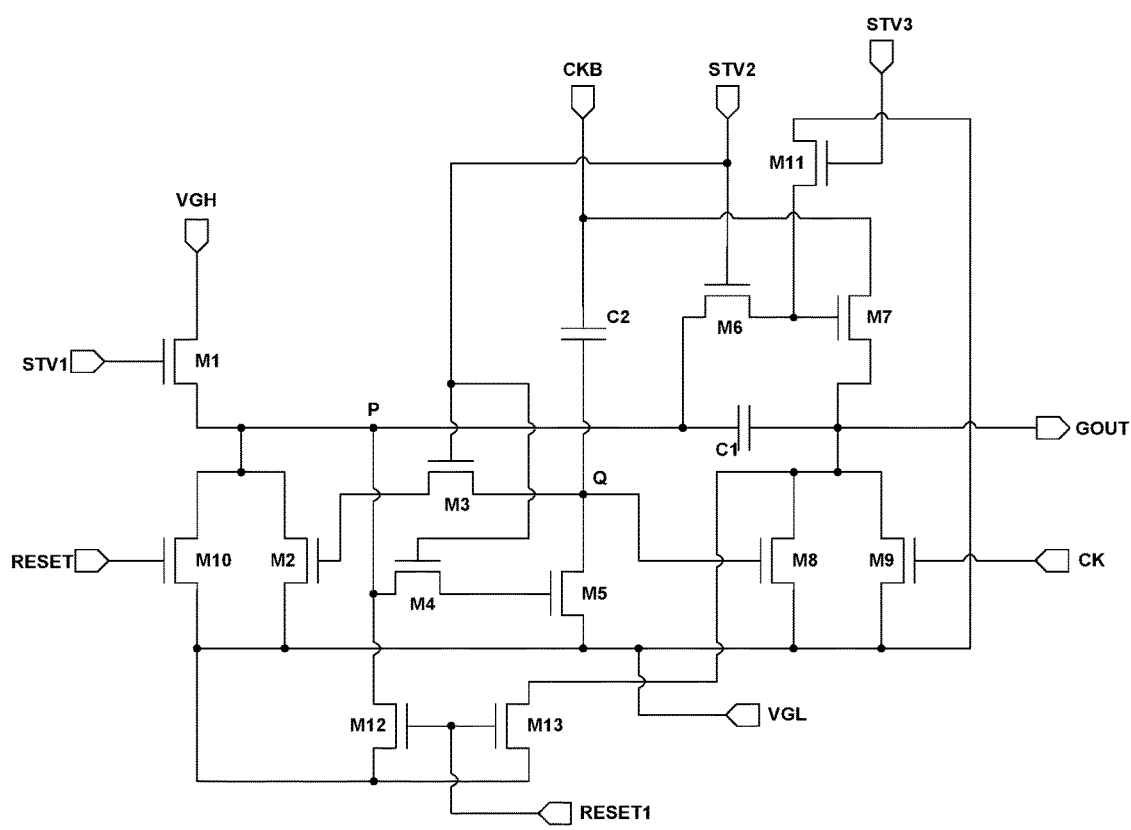
FIG. 3D is a circuit diagram illustrating a further gate controlling unit according to embodiments of the disclosure.

On the basis of the gate controlling unit shown in FIG. 3A, and further referring to FIG. 3D, the gate controlling unit further includes: a second reset subunit, where, the second reset subunit includes a twelfth transistor M12, a thirteen transistor M13 and a second reset signal input terminal RESET1; a gate electrode of the twelfth transistor M12 is electrically connected with the second reset signal input terminal RESET1, a drain electrode of the twelfth transistor M12 is electrically connected with the first node P of the gate driving subunit, and a source electrode of the twelfth transistor M12 is electrically connected with the second level signal input terminal VGL of the gate driving subunit; a gate electrode of the thirteenth transistor M13 is electrically connected with the second reset signal input terminal RESET1, a drain electrode of the thirteenth transistor M13 is electrically connected with the output terminal GOUT of the gate driving subunit, and a source electrode of the thirteenth transistor M13 is electrically connected with the second level signal input terminal VGL of the gate driving subunit. Since the second reset subunit is provided in the gate controlling unit, both the first node P and the output terminal GOUT can be reset when the gate controlling unit is resumed, thereby ensuring both accuracy and precision of the output signal SGOUT of the output terminal GOUT. In such a case, the operating states of the gate controlling unit are as shown in FIG. 3B and as described in the above description, which will not be repeated here.

In FIG. 3D, the first to the thirteenth transistors M1 to M13 are NMOS transistors. Alternatively, the first to the thirteenth transistors M1 to M13 may also be PMOS transistors, and the first to the thirteenth transistors M1 to M13 may also be any of amorphous silicon thin film transistors, Indium Gallium Zinc Oxide thin film transistors and Low Temperature Poly-Silicon thin film transistors.

It is noted that the gate controlling unit in FIG. 3C may further include the second reset subunit which includes the twelfth transistor M12, the thirteenth transistor M13 and the second reset signal input terminal RESET1, and the description thereof is similar to the description of FIG. 3D, which will not be repeated here.

Figure 4:
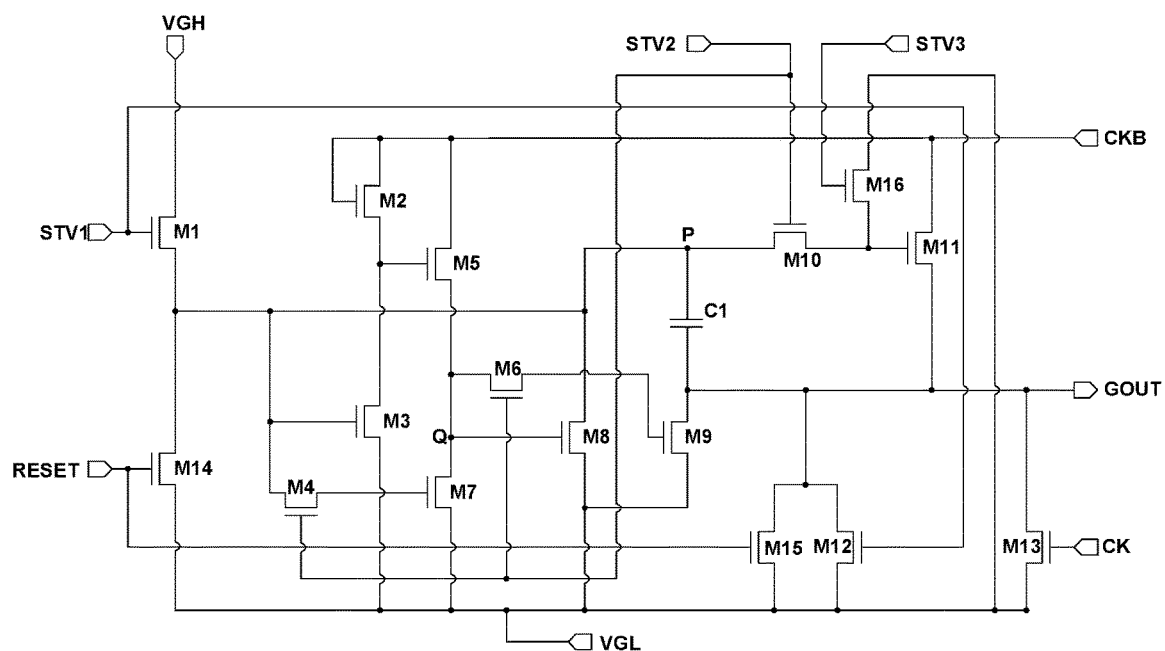
FIG. 4 is a circuit diagram illustrating another gate controlling unit according to embodiments of the disclosure.

In addition to the above embodiments, the gate controlling unit can be further implemented in other embodiments. Referring to FIG. 4, the gate driving subunit included in the gate controlling unit can include: a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a first capacitor C1, a first clock signal input terminal CKB, a second clock signal input terminal CK, a first trigger signal input terminal STV1, a second trigger signal input terminal STV2, a first level signal input terminal VGH, a second level signal input terminal VGL and an output terminal GOUT; a gate electrode of the first transistor M1 is electrically connected with the first trigger signal input terminal STV1, a drain electrode of the first transistor M1 is electrically connected with the first level signal input terminal VGH, and a source electrode of the first transistor M1 is electrically connected with a first node P; both a gate electrode and a drain electrode of the second transistor M2 are electrically connected with the first clock signal input terminal CKB, and a source electrode of the second transistor M2 is electrically connected with a drain electrode of the third transistor M3; a gate electrode of the third transistor M3 is electrically connected with the first node P, a source electrode of the third transistor M3 is electrically connected with the second level signal input terminal VGL, and the drain electrode of the third transistor M3 is electrically connected with the source electrode of the second transistor M2; a gate electrode of the fourth transistor M4 is electrically connected with the second trigger signal input terminal STV2, a drain electrode of the fourth transistor M4 is electrically connected with the first node P, and a source electrode of the fourth transistor M4 is electrically connected with a gate electrode of the seventh transistor M7; a gate electrode of the fifth transistor M5 is electrically connected with the source electrode of the second transistor M2, a drain electrode of the fifth transistor M5 is electrically connected with the first clock signal input terminal CKB, and a source electrode of the fifth transistor M5 is electrically connected with the second node Q; a gate electrode of the sixth transistor M6 is electrically connected with the second trigger signal input terminal STV2, a drain electrode of the sixth transistor M6 is electrically connected with the second node Q, and a source electrode of the sixth transistor M6 is electrically connected with a gate electrode of the ninth transistor M9; the gate electrode of the seventh transistor M7 is electrically connected with the source electrode of the fourth transistor M4, a drain electrode of the seventh transistor M7 is electrically connected with the second node Q, and a source electrode of the seventh transistor M7 is electrically connected with the second level signal input terminal VGL; a gate electrode of the eighth transistor M8 is electrically connected with the second node Q, a drain electrode of the eighth transistor M8 is electrically connected with the first node P, and a source electrode of the eighth transistor M8 is electrically connected with the second level signal input terminal VGL; a gate electrode of the ninth transistor M9 is electrically connected with the source electrode of the sixth transistor M6, a drain electrode of the ninth transistor M9 is electrically connected with the output terminal GOUT, and a source electrode of the ninth transistor M9 is electrically connected with the second level signal input terminal VGL; a gate electrode of the tenth transistor M10 is electrically connected with the second trigger signal input terminal STV2, a drain electrode of the tenth transistor M10 is electrically connected with a gate electrode of the eleventh transistor M11, and a source electrode of the tenth transistor M10 is electrically connected with the first node P; the gate electrode of the eleventh transistor M11 is electrically connected with the drain electrode of the tenth transistor M10, a drain electrode of the eleventh transistor M11 is electrically connected with the first clock signal input terminal CKB, and a source electrode of the eleventh transistor M11 is electrically connected with the output terminal GOUT; a gate electrode of the twelfth transistor M12 is electrically connected with the first trigger signal input terminal STV1, a drain electrode of the twelfth transistor M12 is electrically connected with the second level signal input terminal VGL, and a source electrode of the twelfth transistor M12 is electrically connected with the output terminal GOUT; a gate electrode of the thirteenth transistor M13 is electrically connected with the second clock signal input terminal CK, a drain electrode of the thirteenth transistor M13 is electrically connected with the second level signal input terminal VGL, and a source electrode of the thirteenth transistor M13 is electrically connected with the output terminal GOUT; a first plate of the first capacitor C1 is electrically connected with the first node P, and a second plate of the first capacitor C1 is electrically connected with the output terminal GOUT.

Referring to FIG. 4, the first reset subunit forming the gate controlling unit includes: a fourteenth transistor M14, a fifteenth transistor M15 and a first reset signal input terminal RESET, where, a gate electrode of the fourteenth transistor M14 is electrically connected with the first reset signal input terminal RESET, a drain electrode of the fourteenth transistor M14 is electrically connected with the first node P of the gate driving subunit, and a source electrode of the fourteenth transistor M14 is electrically connected with the second level signal input terminal VGL of the gate driving subunit; a gate electrode of the fifteenth transistor M15 is electrically connected with the first reset signal input terminal RESET, a drain electrode of the fifteenth transistor M15 is electrically connected with the output terminal GOUT of the gate driving subunit, and a source electrode of the fifteenth transistor M15 is electrically connected with the second level signal input terminal VGL of the gate driving subunit; and the suspension and resumption subunit forming the gate controlling unit includes: a sixteenth transistor M16 and a third trigger signal input terminal STV3, where, a gate electrode of the sixteenth transistor M16 is electrically connected with the third trigger signal input terminal STV3, a drain electrode of the sixteenth transistor M16 is electrically connected with the second level signal input terminal VGL of the gate driving subunit, and a source electrode of the sixteenth transistor M16 is electrically connected with the gate electrode of the eleventh transistor M11 of the gate driving subunit.

As shown in FIG. 4, the first to the sixteenth transistors M1 to M16 are NMOS transistors and operation of the gate controlling unit is described herein with reference to using NMOS transistors. Alternatively, the first to the sixteenth transistors M1 to M16 can be PMOS transistors, where the corresponding operating principle is similar to the case where NMOS transistors are used, with the difference being that high level and low level signals are interchanged, which is not discussed repeatedly herein.

Further, the first to the sixteenth transistors M1 to M16 can be any of amorphous silicon thin film transistors, IGZO thin film transistors and LTPS thin film transistors. When each of the above transistors is the LTPS thin film transistor, the transistor includes two LTPS thin film transistors, where, a source electrode of a first LTPS thin film transistor from the two LTPS thin film transistors is used as a source electrode of the transistor, a drain electrode of the first LTPS thin film is electrically connected with a source electrode of a second LTPS thin film transistor, a drain electrode of the second LTPS thin film transistor is used as a drain electrode of the, and the gate electrodes of the two LTPS thin film transistors are electrically connected together to be used as a gate electrode of the transistor. When the transistors are LTPS thin film transistors and configured in the above manner, the configured transistor can prevent leakage and threshold shift.

Further, the first level signal input terminal VGH is configured for receiving a first level signal, the second level signal input terminal VGL is configured for receiving a second level signal, and both the first level signal and the second level signal are constant signals; the first clock signal input terminal CKB is configured for receiving a first clock signal, the second clock signal input terminal CK is configured for receiving a second clock signal, where both the first clock signal and the second clock signal are pulse signals, and the first clock signal is the inverse of the second clock signal; the first trigger signal input terminal STV1 is configured for receiving a first trigger signal, the second trigger signal input terminal STV2 is configured for receiving a second trigger signal, the third trigger signal input terminal STV3 is configured for receiving a third trigger signal, where the first trigger signal, the second trigger signal, and the third trigger signal all are pulse signals, and the second trigger signal is the inverse of the third trigger signal; and the first reset signal input terminal RESET is configured for receiving a first reset signal, and the first reset signal is a pulse signal.

In FIG. 4, it is noted that the first clock signal, the second clock signal, the first trigger signal, the second trigger signal and the third trigger signal all can have a high level larger than 5V and a low level in the range from −15V to −3V; additionally, the first level signal is a high level signal, the level value of the first level signal can be larger than or equal to 5V, the second level signal is a low level signal, the level value of the second level signal can be in a range from −15V to −3V; additionally, the level value of each of the above signals can also be provided according to design types of the transistors and actual requirements.

Since the application of various signals in FIG. 4 can be the same as the application of various signals in FIG. 3A, FIG. 3B can be regarded as a timing diagram of various signals of the gate controlling unit of FIG. 4. Next, the operating principle of the gate controlling unit of FIG. 4 is further illustrated in combination with FIG. 3B.

Referring to FIGS. 4 and 3B, operating states of the gate controlling unit can include: a charging stage T1, a scanning signal generating stage T2, a suspension stage T3 and a resumption stage.

In the charging stage T1, the first trigger signal SSTV1 having a high level controls the first transistor M1 to turn on, the second trigger signal SSTV2 having a high level controls the tenth transistor M10 to turn on, the third trigger signal SSTV3 having a low level controls the sixteenth transistor M16 to turn off, the second clock signal SCK having a low level controls the thirteenth transistor M13 to turn off, the first level signal SVGH having a high level is applied to the gate electrode of the eleventh transistor M11 via the first node P and the tenth transistor M10 in order to control the eleventh transistor M11 to turn on, the first clock signal SCKB (the first clock signal SCKB is a low level signal in the charging stage) which is the inverse of the first trigger signal in the charging stage T1 is applied to the output terminal GOUT via the eleventh transistor M11 so that the first clock signal SCKB is used as an output signal SGOUT of the charging stage, and the first level signal SVGH is employed for charging the first node P.

In the scanning signal generating stage T2, the first trigger signal SSTV1 having a low level controls the first transistor M1 to turn off, the second trigger signal SSTV2 having a high level controls the tenth transistor M10 to turn on, the third trigger signal SSTV3 having a low level controls the sixteenth transistor M16 to turn off, the second clock signal SCK having a low level controls the thirteenth transistor M13 to turn off, a potential of the first node P is applied to the gate electrode of the eleventh transistor M11 via the tenth transistor M10 in order to control the eleventh transistor M11 to turn on, the first clock signal SCKB (the first clock signal SCKB is a high level signal in the scanning signal generating stage T2), having a high level similar to the first trigger signal SSTV1 in the charging stage T1, is applied to the output terminal GOUT via the eleventh transistor M11 so that the first clock signal SCKB is used as an output signal SGOUT of the scanning signal generating stage T2, and the output signal SGOUT is a scanning signal for driving a gate line.

In the suspension stage T3, the second trigger signal SSTV2 having a low level controls the tenth transistor M10 to turn off, the third trigger signal SSTV3 having a high level controls the sixteenth transistor M16 to turn on, and the gate controlling unit suspends the generation of the scanning signal.

In the resumption stage, the second trigger signal SSTV2 having a high level controls the tenth transistor M10 to turn on, the third trigger signal SSTV3 having a low level controls the sixteenth transistor M16 to turn off, and the gate controlling unit resumes the generation of the scanning signal.

A description of each of the various operating stages of the gate controlling unit in FIG. 4 is similar to the corresponding description of the operating stages of the gate controlling unit in FIG. 3A, which will not be repeated here.

Embodiments of the disclosure provide a gate controlling circuit, including n stages of the cascaded gate controlling units connected in series, where, n is a positive integer, and the gate controlling circuit suspends and resumes several times within a frame. The gate controlling units can be any of the gate controlling units described herein.

Figure 5A:
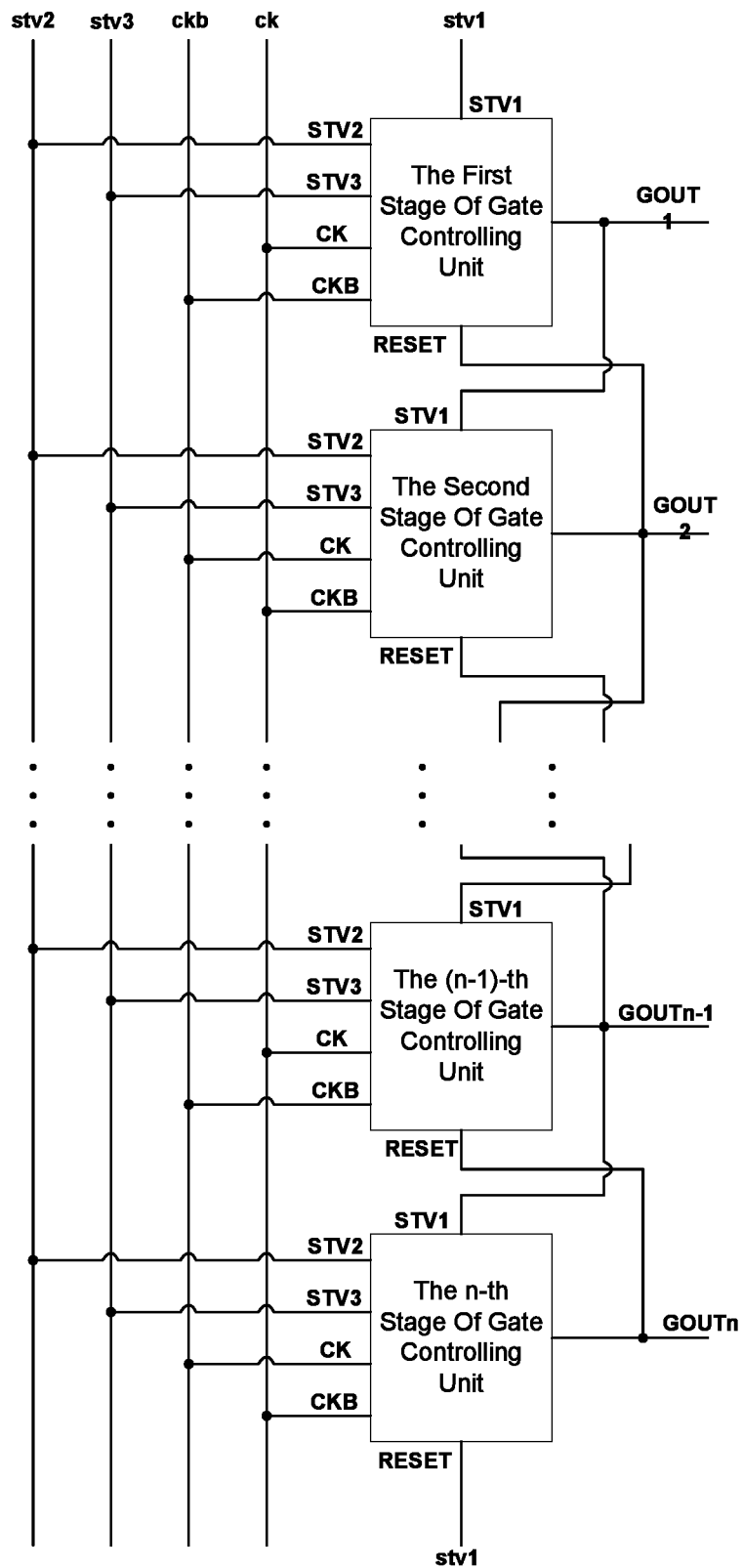
FIG. 5A is a schematic diagram illustrating the structure of a gate controlling unit according to embodiments of the disclosure.

FIG. 5A is a schematic diagram illustrating the structure of a gate controlling circuit, according to embodiments of the disclosure. As shown in FIG. 5A, the gate controlling circuit includes: a first clock signal line ckb, a second clock signal line ck, a first trigger signal line stv1, a second trigger signal line stv2 and a third trigger signal line stv3. The first trigger signal input terminal STV1 of the first stage of gate controlling unit is electrically connected with the first trigger signal line stv1, the output terminal GOUT1 of the first stage of gate controlling unit is electrically connected with the first trigger signal input terminal STV1 of the second stage of gate controlling unit, the output terminal GOUTm of the m-th stage of gate controlling unit is electrically connected with the first reset signal input terminal RESET of the (m−1)-th stage of gate controlling unit and the first trigger signal input terminal STV1 of the (m+1)-th stage of gate controlling unit, respectively, wherein, m is a positive integer larger than or equal to 2 and smaller than or equal to (n−1). The output terminal GOUTn of the n-th stage of gate controlling unit is electrically connected with the first reset signal input terminal RESET of the (n−1)-th stage of gate controlling unit, and the n-th stage of gate controlling unit is reset by the first trigger signal from the first trigger signal line stv1 at the beginning of scanning of the next frame. The second trigger signal input terminal STV2 of each stage of gate controlling unit is electrically connected with the second trigger signal line stv2, and the third trigger signal inputting terminal STV3 of each stage of gate controlling unit is electrically connected with the third trigger signal line stv3. The first clock signal input terminal CKB from each of the odd stages of gate controlling units is electrically connected with the first clock signal line ckb, and the second clock signal input terminal CK from each of the odd stages of gate controlling units is electrically connected with the second clock signal line ck. The first clock signal input terminal CKB from each of the even stages of gate controlling units is electrically connected with the second clock signal line ck, and the second clock signal input terminal CK from each of the even stages of gate controlling units is electrically connected with the first clock signal line ckb.

It is noted that the scanning signal from each stage of the gate controlling units is configured for driving a gate line during the operation of the gate controlling circuit. Since the first trigger signal from the first trigger signal line stv1 may fluctuate due to being subjected to interference, and in turn affect the scanning signal generated by the gate controlling circuit, a virtual gate controlling unit can be connected in series with and followed by the first stage of gate controlling unit in order to avoid such affection, so that the first trigger signal drives the virtual gate controlling unit at the beginning, and then the virtual scanning signal generated by the virtual gate controlling unit is merely configured for driving the first stage of gate controlling unit rather than a gate line, thereby reducing the affection of the first trigger signal on the scanning signal.

Furthermore, the first clock signal input terminal CKB and the second clock signal input terminal CK of each of the gate controlling units are electrically connected with the first clock signal line ckb and/or the second clock signal line ck. In some embodiments, the first clock signal input terminal CKB from each of the odd stages of the gate controlling units is electrically connected with the second clock signal line ck, the second clock signal input terminal CK from each of the odd stages of the gate controlling units is electrically connected with the first clock signal line ckb; the first clock signal input terminal CKB from each of the even stages of the gate controlling units is electrically connected with the first clock signal line ckb, and the second clock signal input terminal CK from each of the even stages of the gate controlling units is electrically connected with the second clock signal line ck.

The first reset signal input terminal RESET of the n-th stage of gate controlling unit is electrically connected with the first trigger signal line stv1 in FIG. 5A to reset the stage of gate controlling unit at the beginning of scanning of the next frame. In some embodiments, other manners may be employed to reset the stage of gate controlling unit. For example, the first trigger signal line electrically connected with the first reset signal input terminal RESET of the n-th stage of gate controlling unit in FIG. 5A is replaced by the first reset signal line, and by applying a corresponding reset signal to the first reset signal line, the n-th stage of gate controlling unit can be controlled to be reset at the beginning of the next frame.

Figure 5B:
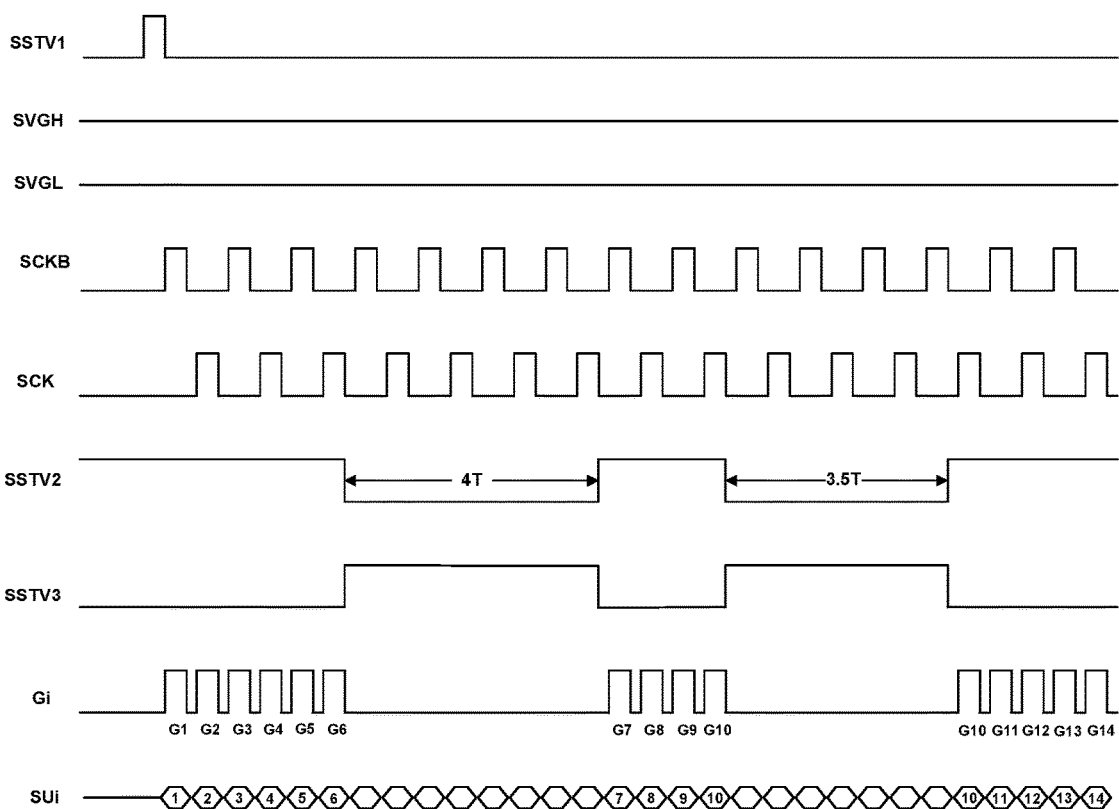
FIG. 5B is a timing diagram illustrating various signals of the gate controlling circuit in FIG. 5A within a frame.

FIG. 5B is a timing diagram of various signals of the gate controlling circuit of FIG. 5A within a frame. As shown in FIG. 5B, SSTV1 represents the first trigger signal from the first trigger signal line stv1, SSTV2 represents the second trigger signal from the second trigger signal line stv2, SSTV3 represents the third trigger signal from the third trigger signal line stv3, SCKB represents the first clock signal from the first clock signal line ckb, SCK represents the second clock signal from the second clock signal line ck, SVGH represents the first level signal, SVGL represents the second level signal, Gi represents the scanning signal outputted from the output terminal GOUTi of the i-th stage of gate controlling unit, and SUi represents a data signal. The scanning signal generated by each of the gate controlling units can drive a gate line, and the corresponding data signal can be inputted into a row of pixel units controlled by the gate line. Next, the operating principle of the gate controlling circuit in FIG. 5A is further illustrated in combination with FIG. 5B.

Referring to FIGS. 5A and 5B, after the gate controlling circuit starts to work, a high level is applied to the first trigger signal SSTV1, the second trigger signal SSTV2 is a high level signal, and the third trigger signal SSTV3 is a low level signal. At this time, the first trigger signal SSTV1 can drive the first stage of gate controlling unit to enable the operation of the first stage of gate controlling unit so as to generate a first stage of scanning signal G1. The output terminal GOUT1 of the first stage of gate controlling unit is electrically connected with the first trigger signal input terminal STV1 of the second stage of gate controlling unit, and the generated first stage of scanning signal G1 is configured for driving the second stage of gate controlling unit to enable the operation of the second stage of gate controlling unit so as to generate a second stage of scanning signal G2 which is in turn fed back to the first reset signal input terminal RESET of the first stage of gate controlling unit to turn off the first stage of gate controlling unit. With changes in each of the first clock signal SCKB and the second clock signal SCK, each of the remaining stages of the gate controlling units is driven sequentially so as to generate respective scanning signals. After a sixth stage of scanning signal is generated, the second trigger signal SSTV2 is changed to a low level signal and the third trigger signal SSTV3 is changed to a high level signal, so that the generation of the scanning signals is stopped, and the gate controlling circuit is in the suspension state. At this time, a seventh stage of gate controlling unit finished the charging stage, but the seventh stage of scanning signal is not yet generated, and thus the sixth stage of gate controlling unit is not yet turned off. The gate controlling circuit has a suspension time period of 4T, where, T represents a cycle period of the first clock signal SCKB and the second clock signal SCK. Then, the second trigger signal SSTV2 is changed to a high level signal, and the third trigger signal SSTV3 is changed to a low level signal, so that the gate controlling circuit is resumed and continues generating the scanning signal. After the gate controlling circuit is resumed, the first clock signal SCKB is changed to a high level signal at the beginning, and correspondingly, the second clock signal SCK is a low level signal. The first clock signal input terminal CKB of the sixth stage of gate controlling unit has received the second clock signal SCK (since the first clock signal input terminal CKB of the sixth stage of gate controlling unit is electrically connected with the second clock signal line ck). The first clock signal input terminal CKB of the seventh stage of gate controlling unit has received the first clock signal SCKB (the first clock signal input terminal CKB of the seventh stage of gate controlling unit is electrically connected with the first clock signal line ckb), so that the output signal of the sixth stage of gate controlling unit is a low level signal rather than the sixth stage of scanning signal, and the output signal of the seventh stage of gate controlling unit is a high level signal and is further the seventh stage of scanning signal. As a result, after the gate controlling circuit is resumed, the seventh stage of scanning signal is first generated.

In FIG. 5B, after the seventh stage of scanning signal is generated, with changes of both the first clock signal SCKB and the second clock signal SCK, each of the stages of the gate controlling units is driven sequentially and generates respective scanning signals. After the tenth stage of scanning signal is generated, the second trigger signal SSTV2 becomes again a low level signal, the third trigger signal SSTV3 becomes again a high level signal, the generation of the scanning signal is stopped, and the gate controlling circuit is again in the suspension state. At this time, the eleventh stage of gate controlling unit has finished the charging stage, but the eleventh stage of scanning signal is not yet generated, so that the tenth stage of gate controlling unit is not yet turned off. The gate controlling circuit has a suspension time period of 3.5T, then the second trigger signal SSTV2 becomes again a high level signal, and the third trigger signal SSTV3 becomes again a low level signal, so that the gate controlling circuit is again resumed and continues generating the scanning signal. After the gate controlling circuit is resumed again, the second clock signal SCK first becomes a high level signal, and accordingly, the first clock signal SCKB is a low level signal, the first clock signal input terminal CKB of the tenth stage of gate controlling unit has received the second clock signal SCK (the first clock signal input terminal CKB of the tenth stage of gate controlling unit is electrically connected with the second clock signal line ck), the first clock signal input terminal CKB of the eleventh stage of gate controlling unit has received the first clock signal SCKB (the first clock signal input terminal CKB of the eleventh stage of gate controlling unit is electrically connected with the first clock signal line ckb), so that the output signal of the tenth stage of gate controlling unit is a high level signal and is further the tenth stage of scanning signal, and the output signal of the eleventh stage of gate controlling unit is a low level signal rather than the eleventh stage of scanning signal. As a result, after the gate controlling circuit is resumed, the tenth stage of scanning signal is first generated, and then with changes of both the first clock signal SCKB and the second clock signal SCK, each of the stages of the gate controlling units is driven sequentially and generates respective scanning signals.

With respect to the operating timing of the above gate controlling circuit, illustratively, after the sixth stage of scanning signal is generated, the second trigger signal SSTV2 is changed to a low level signal, and after the tenth stage of scanning signal is generated, the second trigger signal SSTV2 is changed to a low level signal. However, in actual operation, the gate controlling circuit can be suspended and resumed anytime and anywhere, depending on the specific configuration according to actual requirements rather than merely limiting to suspensions at the above-mentioned sixth stage of scanning signal and the tenth stage of scanning signal.

In summary, the gate controlling circuit can be suspended and resumed several times within each frame, and both the starting time point and the time period of the suspension can be configured as desired.

Figure 6:
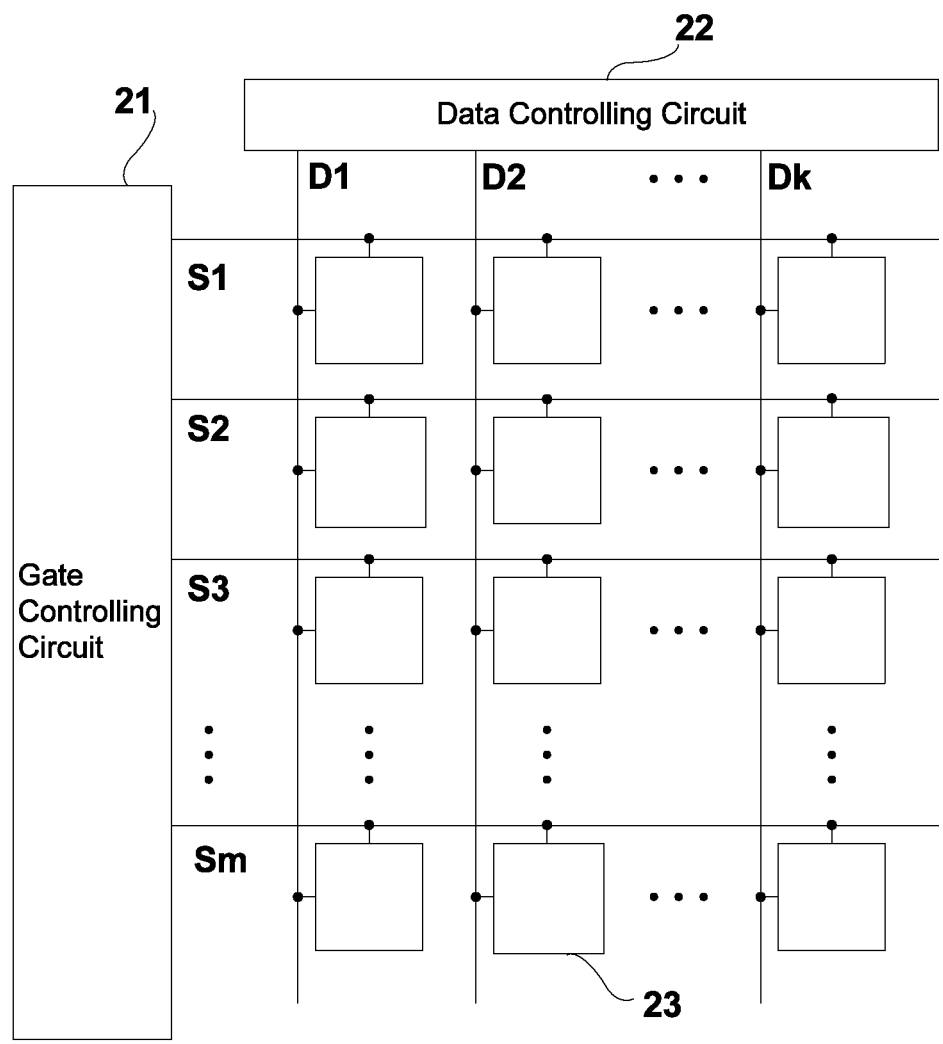
FIG. 6 is a schematic diagram illustrating the structure of an array substrate according to embodiments of the disclosure.

Embodiments of the disclosure provide an array substrate. FIG. 6 is a schematic diagram of the structure of the array substrate according to embodiments of the disclosure. Referring to FIG. 6, the array substrate includes: a gate controlling circuit 21, a data controlling circuit 22, m gate lines (S1, S2, Sm), k data lines (D1, D2, Dk) and a plurality of pixel units 23, where, the gate controlling circuit 21 is the gate controlling circuit of FIGS. 5A and 5B.

Specifically, the gate controlling circuit 21 is configured for providing each of the gate lines (S1, S2, Sn) with a scanning signal; the data controlling circuit 22 is configured for providing each of the data lines (D1, D2, . . . , Dm) with a data signal; the pixel units 23 are located within regions formed by intersecting the gate lines with the data lines.

Figure 7:
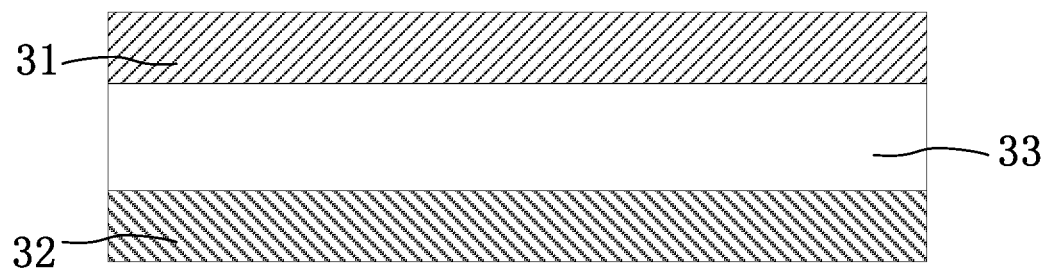
FIG. 7 is a schematic diagram illustrating the structure of a display panel according to embodiments of the disclosure.

Embodiments of the disclosure provide a display panel. FIG. 7 is a schematic diagram illustrating the structure of the display panel according to embodiments of the disclosure. Referring to FIG. 7, the display panel includes a first substrate 31, a second substrate 32 disposed opposite to the first substrate 31, and an interlayer 33 between the first substrate 31 and the second substrate 32, where, the interlayer 33 is related to the display types of the display panel. When a liquid crystal display is utilized, the interlayer 33 is a liquid crystal layer, the first substrate 31 may be a color filter substrate, the second substrate 32 may be an array substrate, and the rotation of liquid crystal molecules in the liquid crystal layer is controlled by either an electric field formed between the common electrode provided in the first substrate 31 and the pixel electrode provided in the second substrate 32 (corresponding to a twisted nematic electric field) or an electric field formed between the common electrode and the pixel electrode both provided in the second substrate 32 (corresponding to fringe-field switching or plane conversion electric field) to achieve a display effect.

When an Organic Light Emitting Diode (OLED) is used for display, the interlayer 33 is configured for providing the OLED, the first substrate 31 may be a color filter substrate, a cover glass or a cover lens and so on, the second substrate 32 may be a TFT array substrate, and the OLED in the interlayer 32 is controlled by the second substrate 32 to achieve a display effect.

The second substrate 32 in the above display panel is the array substrate in the above embodiment, which has a gate controlling circuit capable of suspending and resuming several times within a frame, so that the display panel can further suspend and resume several times within a frame. After various in-cell touch systems are employed in the display panel, scanning of the touch signal can be performed during the suspension time period, so that scanning of the touch signal and scanning by the display signals would be time-divided, thereby ensuring the stability of the display system and both improved touch position reporting rate and the better linearity of the touch system. Additionally, during the suspension time period, the display panel can further perform voltage inversion of the data signal, and can choose different inversion modes such as point inversion, row inversion or column inversion depending on the requirements.

With the gate controlling unit, the gate controlling circuit, the array substrate, and the display panel according to the embodiments of the disclosure, the gate controlling unit is provided with the suspension and resumption subunit in order to control the gate controlling unit to be suspended and resumed. Further, the gate controlling circuit formed by the above cascaded gate controlling units connected in series can be suspended and resumed several times within a frame. Similarly, both the array substrate with the gate controlling circuit and the display panel with the array substrate can achieve the suspension and resumption several times within a frame. After various in-cell touch systems are employed in the display panel, scanning of the touch signal can be performed during the suspension time period, so that scanning of the touch signal and scanning by the display signals would be time-divided, thereby ensuring the stability of the display system and both improved touch position reporting rate and the better linearity of the touch system.

It is noted that some embodiments and applied technology principles are described above. It should be understood by those skilled in the art that the disclosure is not limited to particular embodiments described herein. Various changes, readjustments and alternatives can be made by those skilled in the art without departing from the scope of the disclosure. Therefore, although the disclosure describes in detail the above embodiments, the disclosure is not limited to the above embodiments, and can further include more or other embodiments without departing from the disclosure.

Various modifications and additions can be made to the exemplary embodiments discussed without departing from the scope of the disclosure. For example, while the embodiments described above refer to particular features, the scope of the disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. A gate controlling unit, comprising:
   a gate driving subunit configured for driving a gate line;
   a first reset subunit configured for resetting the gate driving subunit after the gate driving subunit finishes driving the gate line; and
   a suspension and resumption subunit configured for controlling the gate driving subunit to suspend and resume the gate driving subunit; wherein
   the first reset subunit comprises: a tenth transistor and a first reset signal input terminal, wherein, a gate electrode of the tenth transistor is electrically connected with the first reset signal input terminal, a drain electrode of the tenth transistor is electrically connected with a first node of the gate driving subunit, and a source electrode of the tenth transistor is electrically connected with a second level signal input terminal of the gate driving subunit; and
   the suspension and resumption subunit comprises: an eleventh transistor and a third trigger signal input terminal, wherein, a gate electrode of the eleventh transistor is electrically connected with the third trigger signal input terminal, a drain electrode of the eleventh transistor is electrically connected with a second level signal input terminal of the gate driving subunit, and a source electrode of the eleventh transistor is electrically connected with a gate electrode of a seventh transistor of the gate driving subunit.

2. A gate controlling circuit, comprising n stages of cascaded gate controlling units connected in series, with each of which being the gate controlling unit of claim 1, wherein, n is a positive integer, and the gate controlling circuit suspends and resumes several times within a frame.

3. The gate controlling circuit of claim 2, wherein the gate controlling circuit further comprises: a first clock signal line, a second clock signal line, a first trigger signal line, a second trigger signal line and a third trigger signal line;
   a first trigger signal input terminal of a first stage of gate controlling unit is electrically connected with the first trigger signal line, the output terminal of the first stage of gate controlling unit is electrically connected with the first trigger signal input terminal of a second stage of gate controlling unit, the output terminal of the m-th stage of gate controlling unit is electrically connected with the first reset signal input terminal of the (m−1)-th stage of gate controlling unit and the first trigger signal input terminal of the (m+1)-th stage of gate controlling unit, respectively, wherein, m is a positive integer larger than 2 and small than or equal to (n−1), the output terminal of the n-th stage of gate controlling unit is electrically connected with the first reset signal input terminal of the (n−1)-th stage of gate controlling unit, and the n-th stage of gate controlling unit is reset at the beginning of scanning of the next frame;
   a second trigger signal input terminal of each stage of gate controlling unit is electrically connected with the second trigger signal line, and the third trigger signal input terminal of each stage of gate controlling unit is electrically connected with the third trigger signal line;
   a first clock signal input terminal from each of odd stages of gate controlling unit is electrically connected with the first clock signal line, a second clock signal input terminal from each of odd stages of gate controlling unit is electrically connected with the second clock signal line; the first clock signal input terminal from each of even stages of gate controlling unit is electrically connected with the second clock signal line, and the second clock signal input terminal from each of even stages of gate controlling unit is electrically connected with the first clock signal line; or
   the first clock signal input terminal from each of odd stages of gate controlling unit is electrically connected with the second clock signal line, the second clock signal input terminal from each of odd stages of gate controlling unit is electrically connected with the first clock signal line; the first clock signal input terminal from each of even stages of gate controlling unit is electrically connected with the first clock signal line, and the second clock signal input terminal from each of even stages of gate controlling unit is electrically connected with the second clock signal line.

4. The gate controlling circuit of claim 3, wherein, the first trigger signal line is also electrically connected with the first reset signal input terminal of the n-th stage of gate controlling unit; or the gate controlling circuit further comprises a first reset signal line which is electrically connected with the first reset signal input terminal of the n-th stage of gate controlling unit.

5. An array substrate, comprising the gate controlling circuit of claim 2.

6. A display panel, comprising the array substrate of claim 5.

\* \* \* \* \*